(12) United States Patent
Souriau

(10) Patent No.: US 10,173,890 B2
(45) Date of Patent: Jan. 8, 2019

(54) MICROELECTRONIC DEVICE HOUSING BEARING ON THE MICROELECTRONIC DEVICE

(71) Applicant: COMMISSARIAT A L'ENERGIE ATOMIQUE ET AUX ENERGIES ALTERNATIVES, Paris (FR)

(72) Inventor: Jean-Charles Souriau, Saint-Egreve (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 15/628,978

(22) Filed: Jun. 21, 2017

(65) Prior Publication Data

US 2018/0037454 A1    Feb. 8, 2018

(30) Foreign Application Priority Data

Jun. 22, 2016    (FR) ...................................... 16 55795

(51) Int. Cl.
*B81B 7/00*    (2006.01)
*H01L 23/057*    (2006.01)
(Continued)

(52) U.S. Cl.
CPC .............. *B81B 7/007* (2013.01); *H01L 21/52* (2013.01); *H01L 23/057* (2013.01); *H01L 23/10* (2013.01);
(Continued)

(58) Field of Classification Search
CPC . H01L 23/49838; H01L 23/057; H01L 23/18; H01L 23/498; H01L 23/10;
(Continued)

(56) References Cited

U.S. PATENT DOCUMENTS 5,095,359 A    3/1992    Tanaka et al.
5,482,161 A *    1/1996    Williams .......... H01L 21/67369
141/98
(Continued)

FOREIGN PATENT DOCUMENTS

FR    2 954 588 A1    6/2011
FR    2 960 339 A1    11/2011
WO    WO 2010/107926 A1    9/2010

OTHER PUBLICATIONS

French Preliminary Search Report dated Apr. 21, 2017 in French Application 16 55795 filed on Jun. 22, 2016 (with Written Opinion and English Translation of Categories of Cited Documents).

*Primary Examiner* — Alexander Oscar Williams
(74) *Attorney, Agent, or Firm* — Oblon, McClelland, Maier & Neustadt, L.L.P.

(57) ABSTRACT

A box for a microelectronic device includes a first portion and a second portion able to be assembled in order to define, in an assembled position, a housing space for the microelectronic device. A face of the first portion is facing a face of the second portion in the assembled position. The first zones facing the faces form an interface for attaching the first portion and second portion. The second zones face faces forming a cavity for receiving the microelectronic device. At least one among the first portion and the second portion includes at least one element for electrical connection. The first portion and the second portion can apply at least one connection pad of the microelectronic device on the element for connection in the assembled position.

20 Claims, 4 Drawing Sheets

(51) Int. Cl.
*H01L 23/18* (2006.01)
*H01L 23/498* (2006.01)
*H01L 23/10* (2006.01)
*H01L 21/52* (2006.01)

(52) U.S. Cl.
CPC ........ *H01L 23/18* (2013.01); *H01L 23/49838* (2013.01); *B81B 2207/092* (2013.01); *H01L 2924/15153* (2013.01)

(58) Field of Classification Search
CPC ........... H01L 21/52; H01L 2924/15153; B81B 7/007; B81B 2207/092; B81B 7/00
USPC ................ 257/738, 737, 778, 712, 707, 709
See application file for complete search history.

(56) References Cited

U.S. PATENT DOCUMENTS

| | | | | |
|---|---|---|---|---|
| 5,544,007 | A * | 8/1996 | Inoue | G06F 1/1616 361/679.02 |
| 6,029,730 | A | 2/2000 | Gospe et al. | |
| 6,784,535 | B1 * | 8/2004 | Chiu | H01L 23/04 257/704 |
| 8,169,789 | B1 * | 5/2012 | Tong | H01L 23/433 257/712 |
| 2011/0149540 | A1 | 6/2011 | Brun et al. | |
| 2011/0287606 | A1 | 11/2011 | Brun et al. | |

\* cited by examiner

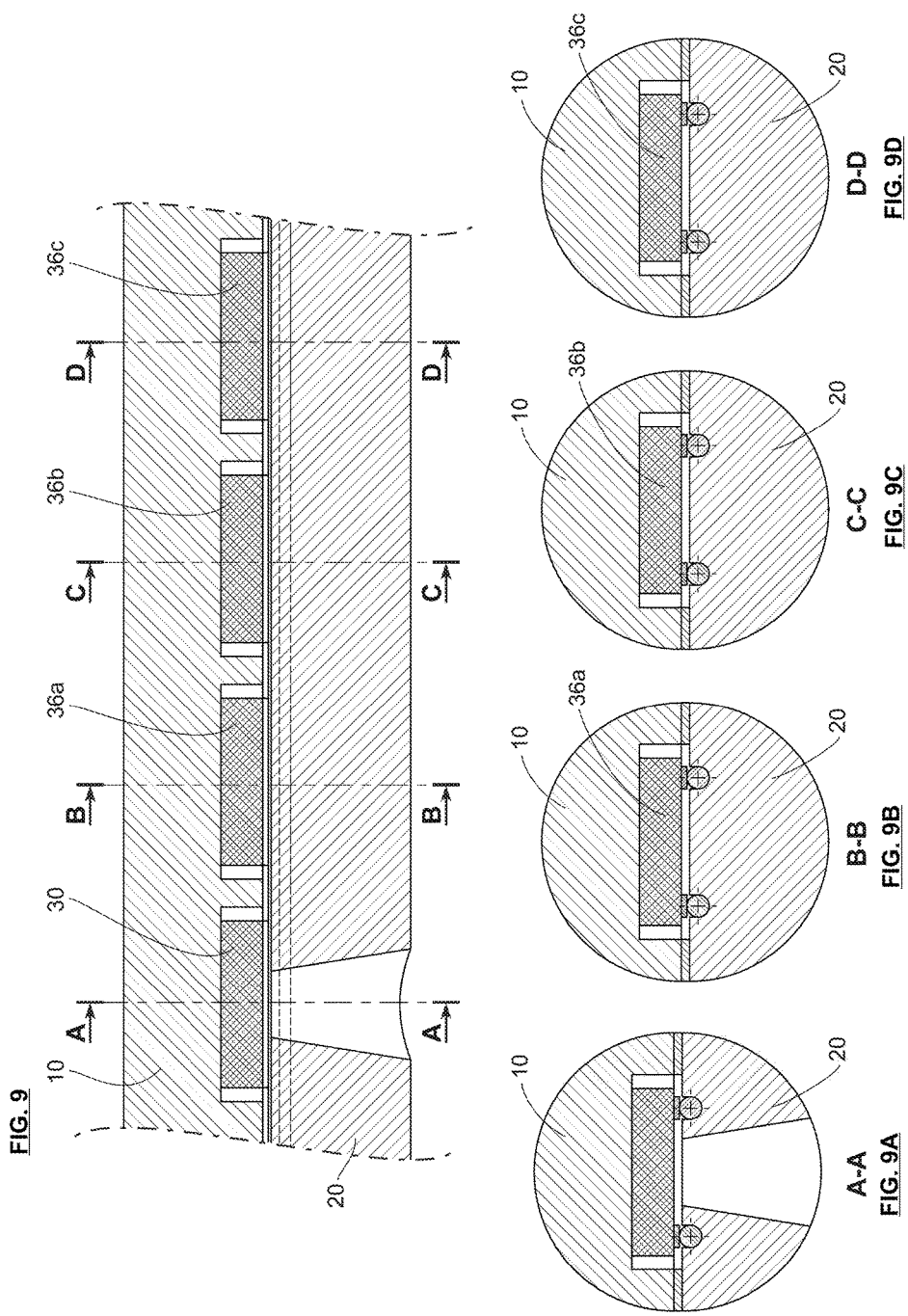

and with regards to the appended drawings which are given as non-exhaustive examples and wherein:

MICROELECTRONIC DEVICE HOUSING BEARING ON THE MICROELECTRONIC DEVICE

FIELD OF THE INVENTION

This invention in general relates to microelectronic components. It particularly relates to packaging and the electrical connection of microelectronic devices integrated into packaging. Packaging corresponds typically to assembly and encapsulation techniques of such devices.

Microelectronic device means any device made with means from microelectronics. In addition to the devices having a purely electronic purpose, these devices include, in particular, micromechanical or electromechanical devices (MEMS, NEMS . . . ) and optical or optoelectronic devices (MOEMS . . . ).

TECHNICAL BACKGROUND

The use of microelectronic devices has amplified and is diversified. Such devices can now be encountered in sectors as varied as medical devices and sensors. In particular, the development of MEMS has generalized opportunities in microelectronics. It remains however that at least certain applications warrant an effective packaging of these devices.

There are methods for electrically connecting microelectronic components together or to another element. The most widespread technique consists in using an interconnection substrate whereon the components are added and connected. Cables can also be soldered of glued directly onto the interconnection substrate. In order to provide protection, the unit is generally coated with a polymer or placed in a box.

For example, publication WO2010/107926 A1 describes an electronic system in a box that can be implanted into the human body. FIG. 1 of this application includes a figure of the box according to this publication. This system is equipped with components 3 carried by a chip 2 which itself is enclosed in a hermetic shell 1. The shell 1 can be in several portions assembled by soldering on the edges thereof. A connection via cables 4 is made between the chip 2 and the exterior, via connectors at the outlet of the shell. This type of packaging is voluminous and the electrical connection is still complicated and meticulous.

It is therefore an object of the invention to overcome at least partially the disadvantages of the current techniques by offering an improved box.

SUMMARY OF THE INVENTION

A non-limiting aspect of the invention relates to a box for a microelectronic device, comprising a first portion and a second portion assembled in order to define, in an assembled position, a housing space for the microelectronic device.

Advantageously, a face of the first portion is facing a face of the second portion in assembled position, first zones facing the faces forming an interface for fastening said first portion and said second portion, second zones facing the faces forming a cavity for receiving the microelectronic device. Furthermore, at least one among the first portion and the second portion preferably comprises at least one element for electrical connection, the first portion and the second portion being configured to apply at least one connection pad of the microelectronic device on the element for connection in assembled position. Preferably, the element for electrical connection opens into the cavity.

As such, a box is produced that effectively carries the microelectronic device and provides at least partially the electrical connection. Preferably, a pressure produced by the two portions of the box in assembled position makes the electrical connection reliable and can also make it possible to immobilize the device. In an embodiment, the device is thrust between the bottom of the cavity and the face of the opposite portion of the box, to the extent that little space is lost along this direction, which allows for greater compactness of the box if needed.

Preferably, at least one element for electrical connection opening into the cavity comprises a trench configured to receive a connection cable.

Another aspect that can be separated of this invention relates to a system comprising at least one microelectronic device and a box.

Another aspect of embodiments of the invention relates to a method for mounting a microelectronic device in a box, the box comprising a first portion and a second portion that can be assembled in order to define, in an assembled position, a housing space of the microelectronic device, at least one among the first portion and the second portion comprising at least one element for electrical connection, the method comprising:

a setting into place of the microelectronic device in the housing space, the first portion and the second portion not being in assembled position;

a placing opposite of a face of the first portion and of a face of the second portion in such a way as to place said portions in assembled position, first zones facing faces forming an interface for the fastening of said first portion and second portion, second zones opposite faces forming a cavity for receiving the microelectronic device, the element for connection opening preferably into the cavity;

an application of at least one connection pad of the microelectronic device on the element for connection in assembled position of the first portion and of the second portion.

BRIEF INTRODUCTION OF THE DRAWINGS

Other characteristics, aims and advantages of this invention will be illustrated in the following detailed description and with regards to the appended drawings which are given as non-exhaustive examples and wherein.

Figure 4A:
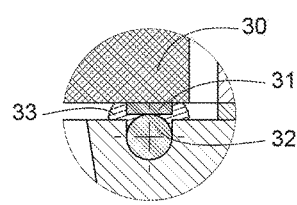
Figure 4B:
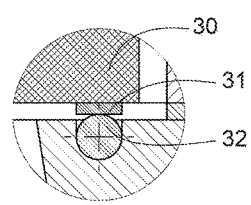
Figure 4C:
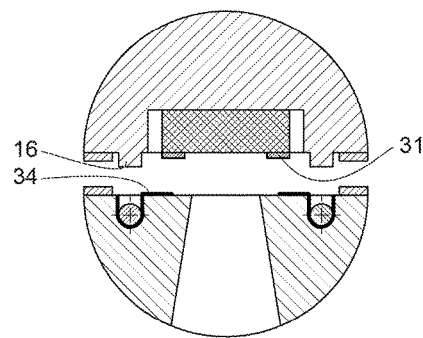

FIGS. 4A, 4B, and 4C show three alternative embodiments of the connection of a microelectronic device carried in the box.

Figure 5A:
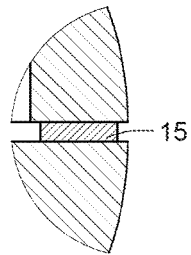
Figure 5B:
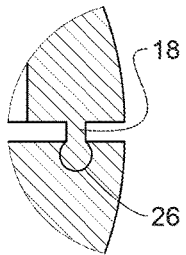

FIGS. 5A, 5B, and, 5C show three different assembly modes for two portions of a box.

Figure 6A:
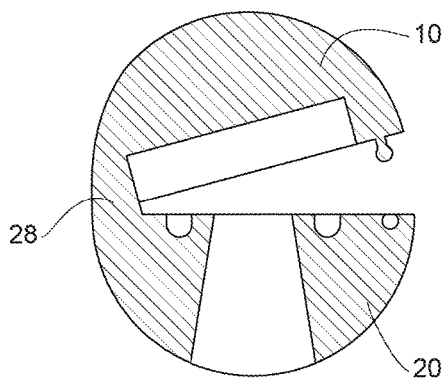
Figure 6B:
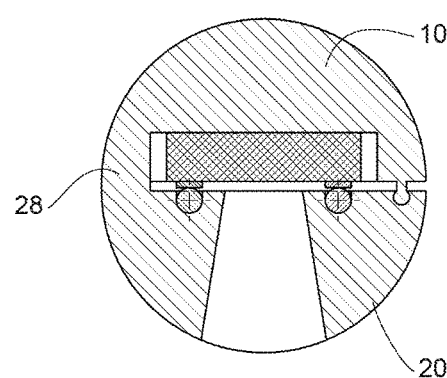

FIGS. 6A and 6B reveal a hinged connection between two box portions, respectively in open position and in closed position.

Figure 7:
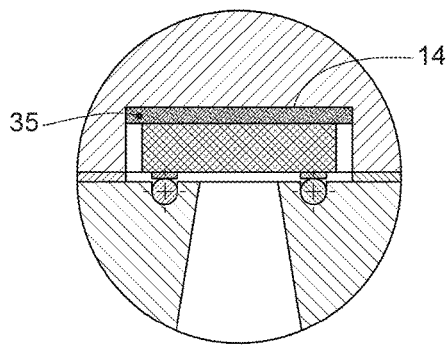

FIG. 7 shows an additional possibility of the invention with a compressible member.

Figure 8:
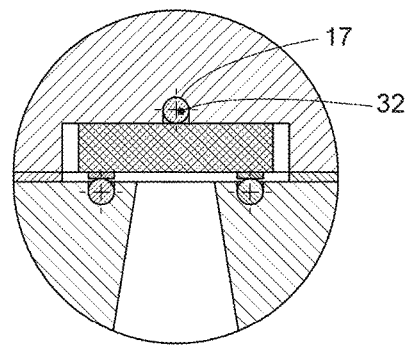

FIG. 8 shows an additional possibility of the invention with an additional connection for the microelectronic device.

FIG. 9 is a global longitudinal cross-section view of a box enclosing a plurality of microelectronic devices and FIGS. 9A-9D contain transverse cross-section views at different locations along the box.

The drawings are given as examples and are not limiting to the invention. They are schematic representations of a principle intended to facilitate the understanding of the invention and are not necessarily on the scale of the practical applications.

DETAILED DESCRIPTION

Before undertaking a detailed review of embodiments of the invention, optional features are listed below that can optionally be used in any combination or alternatively:
- the first portion (10) is configured to exert a bearing on the microelectronic device (30) in the direction of the face of the second portion (20);
- the cavity (12) is delimited by a hollow pattern in the first portion (10), with the hollow pattern having a bottom (14) configured to exert the bearing on the microelectronic device (30).
- at least one element for connections opens into the cavity (12);
- at least one element for connection comprises a trench (24) configured to receive a connection cable and an interconnection member (34) opening into the cavity (12) in such a way as to render applicable a connection pad (31) of the microelectronic device (30) on the interconnection member (34) in assembled position, the interconnection member (34) able to be electrically connected to the connection cable;
- the one among the first portion (10) and the second portion (20) that does not comprise said element for connection comprises a lug (16) facing the trench (24) of the element for connection, configured to exert a bearing on the connection cable (32) in assembled position;
- at least one element for connection comprises a trench (24, 17) the preferably opens into the cavity (12) and configured to receive a connection cable (32) in such a way as to render applicable a connection pad (31) of the microelectronic device (30) on the connection cable (32) in assembled position;
- at least one element for connection comprises a connection cable (32);
- the first portion (10) and the second portion (20) each comprise at least one element for connection;
- the cavity (12) comprises a compressible member (35) configured to be compressed by the microelectronic device (30) in the assembled position;
- at least one among the first portion (10) and the second portion (20) comprises a window that opens into the cavity (12) from the outer wall of said portion;
- the box comprises means mechanical fastening and/or gluing of the first portion (10) onto the second portion (20) in assembled position;
- The first portion (10) and the second portion (20) are connected by a hinged connection (28) on an edge of their faces.
- the system comprises several microelectronic devices of which at least a portion is electrically connected by at least one element for connection.

Possibly, the following options are also possible:
- the cable passages are parallel and possibly oriented along a longitudinal direction of the box;
- the means for mechanical fastening comprise a fastening member on one of the portions able to cooperate with a housing in the other of the portions;
- the means for fastening comprise a fastening member with a stop on one of the portions and with an additional stop on the other portion, the stops being configured to prohibit the disassembly of the two portions;
- the fastening is reversible; this makes it possible to exchange the electronic device if the latter is defective
- the element for connection comprises an interface layer between the stud and the element for connection; this layer can be a conductive glue or a conductive fusible material; this layer can be in contact with a connection cable;
- the bearing between the two portions of the box is mostly and even entirely oriented along a dimension in thickness of the substrate of the microelectronic device;
- the box comprises a plurality of cavities each one dedicated to the housing of a microelectronic device.

It is specified that in the context of the present invention, the term "on" or "above" do not necessarily mean "in contact with." Thus, for example, the deposition of a layer on another layer does not necessarily mean that the two layers are directly in contact with each other, but this means that one of the layers at least partly covers the other while either being directly in contact with it or being separated from it by a film, another layer or another element. A layer can moreover be comprised of several sub-layers of the same material or of different materials.

It is specified that, in the framework of this invention, the thickness of a layer or of a substrate is measured along a direction perpendicular to the surface according to which this layer or this substrate has its maximum extension.

The use of the singular for certain elements of the invention does not necessarily mean that a given element is present singularly in the invention. The word "a" or "an" does not exclusively mean "a single" unless it is arranged otherwise.

The invention proposed here is used for the packaging of microelectronic devices that can comprise several components of which for example at least one interacting with its environment preferably through a window. The components to be connected can be an ASIC (i.e. "Application-Specific Integrated Circuit), a sensor, an actuator, a stimulator, a battery, an RFID chip (i.e. radiofrequency identification), passive components.

The component interacting with its environment can be:
- a pressure sensor, an optical sensor, a sound sensor, an electric sensor, a heat sensor, a biological sensor;
- an electric, optical, sound, thermal stimulator;
- an RFID chip;
- a chip for the delivery of a drug or the sampling of biological cells.

In the case of medical applications, the invention can be used to carry, in an effective manner components with the functions in particular among the following: in vivo blood pressure sensor, in vivo blood coagulation sensor, in vivo oxygen sensor, photonic stimulation, sound stimulation, near infrared illumination 650 nm, 400 n, 170 nm, treatment of degenerative diseases Alzheimer, localized treatment of tumors, optical treatment of the periphery of tumors, heart rate sensor.

Figure 1:
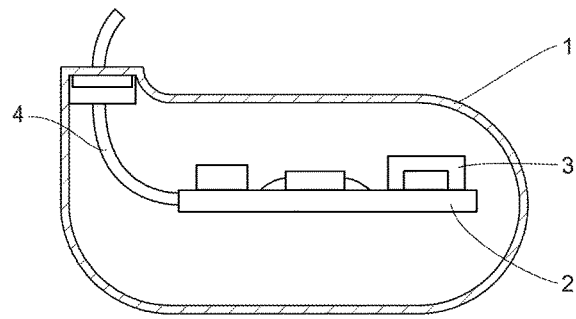
FIG. 1 shows an example of a box according to publication WO2010/107926.
Figure 2:
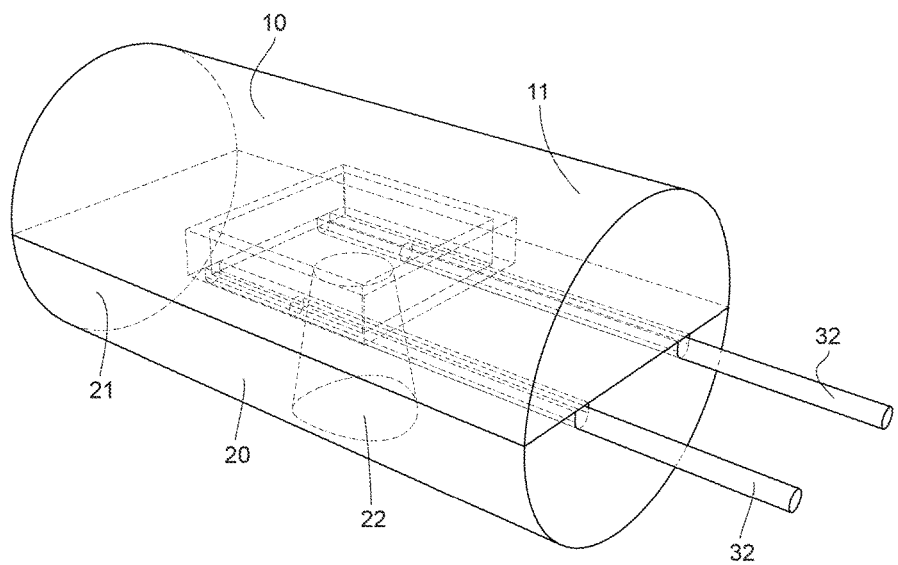
FIG. 2 shows in perspective an embodiment of the invention.

FIG. 2 shows a general view in perspective of an embodiment of the invention. A first portion 10 and a second portion 20 are assembled therein in such a way as to define a space presented as dotted lines allowing for the housing of a microelectronic device that can be of the type mentioned hereinabove. Globally, when the portions 10 and 20 are in assembled position, they define an external wall in two portions respectively 11 and 21. In needed, the external surface formed as such can by airtight and/or watertight or sealed from any other fluid. FIG. 2 moreover shows cables 32 that allow for the electrical connection to the outside of one or several components present on the microelectronic device.

Figure 3A:
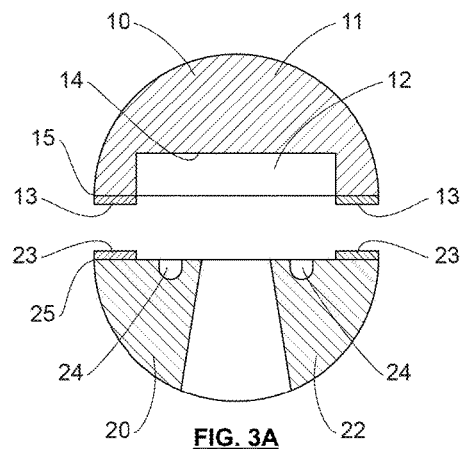
FIGS. 3A and 3B show two portions of a box of the invention in two states, respectively dissociated and assembled.

A transversal cross-section on a cavity for receiving the device is shown in a first embodiment in FIG. 3A. The first portion 10 comprises an external wall 11 which is, in the example, in the form of a half-moon. Opposite the external wall 11, a face of the first portion 10 is located facing a face of the second portion 20 between the face and the wall, the portion 10 can be solid or hollow. In this example, the second portion 20 has a geometrical configuration as a cross-section similar to that of the first portion 10. The longitudinal edges of the external wall 11 intercept the face of the second portion 20 facing that of the first portion 10.

The material used for one/or the other of the first and second portions will be adapted according the application and in particular the resistance, for example mechanical or chemical, desired. As an example, polymer materials can be used such as the following plastic materials: Peek, Polyaryletherketone (PAEK), Polyester, thermoplastic, polyvinyl chloride (PVC), polyethylene, polycarbonate, polypropylene, polyurethane, polysulfone, LCP (Liquid Crystal Polymer).

The manufacture of the box can be carried out in particular by one of the following methods: injection molding, compression molding, 3-D Printing.

Once assembled, the portions of the box can create an envelope having a diameter ranging from 1 mm to 10 mm and a length from 5 mm to 30 mm.

However in the example of FIG. 3A, the face of the first portion 10 comprises a first zone intended to be used as a contact with a first corresponding zone of the second portion 10. For example, the first zone can correspond to a surface located at the edge of the face considered or to two surfaces located on two opposite edges of the face considered. The first zone used for contact with the portion advantageously forms a closed contour at the periphery of the face. As shall be seen, passages in the form of trenches 24 can be an exception to this closed contour. On the first zone of one and/or the other of the faces, a specific layer 15, 25 for assembly can be carried out, for example by a material that favors a seal, by an adhesive material. Reciprocal application zones of the two faces are generally as such formed, corresponding to the marks 13 and 23 and in FIG. 3A.

Figure 3B:
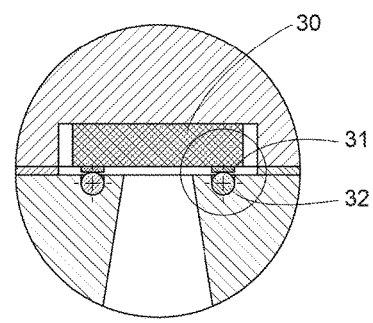

In addition to the first zones that allow for the putting into contact of the first portion 10 and of the second portion 20, the faces of these portions 10, 20 further comprise a second zone making it possible to define the housing space of the microelectronic device. To this effect, the faces that delimit a cavity 12 that can receive this device 30 as shown in FIG. 3B. Cavity 12 can comprise a hollow pattern created in the first portion 10 and having a bottom 14 as well as side walls. In the example, the section of this pattern is rectangular. The facing the face of the second portion 20 can be substantially planar and form the cover of the cavity 12 of which the hollow space is as such substantially formed by the hollow pattern of the first portion 10. This configuration is of course not limiting and it is possible indeed to provide two hollow patterns respectively on the first portion 10 and on the second portion 20, with these two patterns cooperating in such a way as to form together the height of the cavity 12.

The cavity makes it possible to receive a microelectronic device that can integrate various functions. It is preferably of a rectangular parallelepiped shape with typical dimensions of the section of cavity: 3 to 30 mm$^2$, for a length of 2 mm to 25 mm.

Preferably, the bottom 14 is configured to apply on a surface of the microelectronic device 30. Preferably, this application is carried out plane-on-plane. Moreover, advantageously, the bottom 14 is a planar surface parallel to the upper face of the device 30 whereon it applies and/or parallel to the portion facing the face of the second portion 20.

A lateral clearance can be preserved between the device 30 and the side walls of the hollow pattern creating the cavity 12. On the other hand, there is advantageously no clearance according to the thick direction of the device between the latter and the box in such a way that the device is immobilized in this direction.

Advantageously, the dimension in height of the cavity 12, oriented according to the thickness of the substrate of the microelectronic device, is equivalent to the thickness of said device. In this way, the device is effectively housed without capacity of moving inside the cavity 12. Furthermore, this makes it possible to apply a force caught between either side of the device 30 by the intermediary of the portions 10, 20. In addition, the definition of the cavity 12 is the opportunity to carry out at this level an electric connection of one or more components mounted on or in the microelectronic device to the outside or to another microelectronic device of the box. As such, passages 24 can be formed by opening into the cavity 12. The example supplied in FIGS. 3A and 3B has two trenches 24 carried out in the second portion 20. In the illustration, the passages are in the form of trenches 24 parallel to one another and which can moreover be parallel to a longitudinal axis of the box. The trenches make it possible to each receive a cable, preferably a micro cable that can have a diameter between 25 μm and 4 mm. The cables 32 housed in the trenches 24 allow for an electrical connection of the microelectronic device housed in the cavity 12. This connection can in particular be used for electrical power and/or data communication. Compressible cables 32 can be used.

Advantageously, in the embodiment shown in FIG. 3B, the trenches 24 open onto the cavity 12 and have a height less than the diameter of the cables in such a way as to produce an exceeding of a portion of the cable 32 towards the inside of the cavity 12. Thanks to this protruding, a portion of the cable 32 can be put into contact with a pad 31 present on the face facing the device 30. An arrangement is of course carried out to coincide the location of the trenches 24 and the pads 31 to be placed in electrical continuity. There may be as many passages 24 as there are pads 31 to connect. But, a single cable 32 can be used to connect several pads.

In this application, the term pad 31 means any member carried by the microelectronic device 30 that can form an electrical input and/or output terminal for any portion or component of this device 30. The shape of the pads 31 shown does not limit the invention in any way.

In an embodiment, the distance between the bottom 14 of the cavity 12 and the top of the cable 32 protruding towards the inside of the cavity 12 is less than or equal to, and preferably less than or equal to 10%, at the height of the device 30 at this same level (including therefore the height of the 31). A firm application of the pad 31 against the cable 32. Possibly, there is some deformability available in the section of the cable 32 in order to accommodate this phase of the application. As such, in the detailed view provided in FIG. 4B, the cooperation between the pad 31 and the cable 32 operate directly.

In the embodiment supplied in FIG. 4A, an interface layer 33 is added at the level of the contact between the pad 31 and the cable 32. The interface layer 33 can be formed by an electrically-conductive glue or by an electrically-conductive fusible material. In addition to an improvement in the electrical conduction between the two portions, this configuration allows for an increase in the final mechanical coherency.

In another embodiment, the tranches 24 are offset relatively to the cavity 12 and do not open into the latter. This is the case in FIG. 4C which shows passages 24 offset relatively to the zone facing the faces of the portions 10, 20 defining the cavity 12. In order to nevertheless allow for a connection towards the exterior of the pads 31, interconnection member 34 are provided each in cooperation with a trench 24. The interconnection members 34 can be manufactured in the form of metalized zones that cover at least partially the trench 24 considered and extending towards the inside of the cavity 12 in such a way as to be located facing the pad 31 concerned by the connection. As such, the passages can be trenches 24 at least partially metalized and electric raceways make it possible to offset the electrical contacts facing the pads 31. The metalization can be carried out by methods such as the following: laser direct structuring (LDS), bi-injection method (with a non-metalizable material and a metalizable material), conductive ink key method.

Still in reference to the embodiment of FIG. 4C, the portion located facing the one comprising the trench 24 considered can comprise a lug 16 making it possible to exert a bearing on the cable 32 housed in the trench 24 in order to ensure the correct application of the latter against one another. The term "lug" is used in the broad sense; it can be one or several one-off protuberances along the trench 24 or continuously along the passage. In this embodiment, the height of the passage 24 is preferably less than the diameter of the cable 32 in such a way as to arrange a space above the cable 32 for the receiving of the protrusion formed by the lug 16. Preferably, this space remains less than or equal, and preferably less than by 10%, to the height of the lug 16 able to be introduced into the passage in such a way as to produce an application of the lug 16 against the cable 32 and, consequently, the reliability of the application of the cable 32 on the interconnection member 34.

Described hereinabove were possibilities of creating one or more elements for connection allowing for the electrical connection of the device 30 with an element exterior to the box or with an additional element of the box.

It is understood that in a first embodiment an element for connection comprises a trench 24 able to cooperate with a cable 32. In a second embodiment, the element for connection comprises a trench 24, an interconnection member 34 and possibly a cable 32. Other types of elements for connection can fall within the scope of this invention.

Once a device 30 has been suitably housed in the cavity 12, the box of the invention comprises means for ensuring the maintaining in assembled position of the portions 10, 20. These two fastenings can be removable in that it is possible later to open the box so as to extract the device 30 and possibly replace it. In another embodiment, the fastening can be definitive. As such, in the embodiment shown in FIG. 5A, a layer of glue 15 is carried out at the interface between the portions 10, 20, on the first zone of the faces.

On the other hand, the example of FIG. 5B shows a mechanical fastening by the intermediary of a fastening member 18, carried for example by the portion 10, and forming a male portion able to be inserted into a housing 26, carried by the other portion, and forming a female portion wherein the male portion can be embedded. The fastening member 18 can be a button. Several buttons can be distributed on the contour of the box. Furthermore, the term button also covers the realization of a continuous profile on at least one portion of the contour of the faces of the portions 10, 20.

Figure 5C:
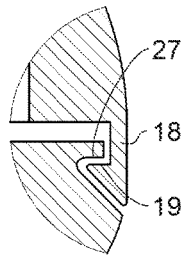

An alternative embodiment is shown in FIG. 5C in which the fastening member 18 comprises an end with a hook defining a stop 19 able to cooperate with a corresponding shape on the other portion of the box, having a stop 27 able to oppose the removal of the portion 18 in the shape of a hook. Advantageously, the insertion of the stop 19 against the stop 27 takes place via elastic deformation of the member 18.

The means for fastening, in particular those described hereinabove, can be distributed over several edges, in particular the longitudinal edges opposite the faces of the portions 10, 20. However, the portions 10, 20 can also be partially integral, even in the unassembled position. An example of this is provided in FIGS. 6A and 6B. FIG. 6A shows an open configuration of the box in which the portions 10, 20 are integral with one of their longitudinal edges which is shared and which forms a hinged zone 28. There is some play available with the deformability in this zone for passing from the open position to the closed position of the bow. This deformability can be supplied by a limitation of the section of the hinged zone 28 and/or by the selection of a material of which the Young's modulus does not provide it with excessive rigidity. This is possible for example with plastic materials for which Young's modulus is less than 20 GPa.

Note that there is play available in terms of deformation advantageously elastic but potentially also plastic of the box when it is placed in assembled position in order to carry out an effective application of the portions 10, 20 ion such a way as to apply on either side of the device 30. Advantageously, the bearing exerted on the device 30 is oriented mostly or entirely along the thickness of the device 30 in such a way as to produce a non-zero force at the interface between the pad 31 and a cable 32 or an interconnection member 34.

FIG. 6B shows the result of the passage of the hinger 28 to the assembled position.

FIG. 7 shows another possibility of the invention with a compressible layer 35 arranged on the bottom 14 of the cavity 12 in such a way as to produce a bearing that is more flexible on the device 30 during the passage to assembled position. Advantageously, the compressible material can be deformed elastically; this can be silicone or elastomer. The dimensions of the elements are configured in such a way as to deform the layer 35 when the device 30 is in place in the cavity 12 and when the portions 10, 20 are in assembled position.

Another option is shown in FIG. 8 with the presence of an additional element for connection on the first portion 10 and not only on the second portion 20. In the case here, a passage 17 receives a cable 32, the passage and the cable are able to be of the same type as those described hereinabove. For example, the passage 17 can be located in the middle of the width of the cavity 12.

The various figures show moreover the presence of a window 22 passing through one of the portions, here the portion 20. This window opens into the cavity 12 and communicates with the outside, by passing through the external wall of the portion that comprises it. Preferably, the window 22 is located in such a way as to open onto one of the faces of the device 30 and preferably on the face opposite the one applied on the bottom 14 of the cavity 12. This window can be used to allow to a fluid to pass, such as a gas or liquid, or to provide the transmission of electromagnetic or sound waves. The window is not necessarily a giant hole and lay be at least partially full, for example with a transparent material, in particular for carrying out an optical lens, for example to perform a focus. Advantageously, the longitudinal axis of the window through the portion that is equipped with it is perpendicular to the bottom 14 of the cavity.

FIGS. 9 and 9A-9D supply an alternative of the various preceding examples in that a plurality of devices are carried in a single box. More precisely, in addition to the device 30, at least one additional device 36a,b,c is present. Advantageously, the box comprises as many cavities as devices to be housed. In addition, these devices can be chained together along a longitudinal direction of the box. Furthermore, at least one element for connection can be common to at least two of these devices. For example, at least one passage extends both at the level of the device 30 and at the level of at least the additional devices 36a,b,c. It is such possible to use a single cable 32 and a single passage 24 or 17 to connect the various devices together and/or with the exterior. In the case shown, the device 30 can be a sensor, the device 36a can be an RFID chip, the device 36b can be a chip with a specific application ASIC and the device 36c an electric battery. Such a unit can be autonomous.

Note through this arrangement that it is not absolutely necessary to have an element for connection that goes to the outside of the box. As such, trenches 24, 17 do not necessarily open towards the outside of the portions 10, 20 of the box. This can therefore be trenches that do not open laterally.

Unless specified otherwise, the technical characteristics described in detail for a given embodiment can be combined with the technical characteristics described in the context of other embodiments described as examples and not exhaustive, including those explained in detail hereinabove.

REFERENCES

1. Shell
2. Chip
3. Component
4. Cable
10. First portion
11. External wall
12. Cavity
13. Application zone
14. Bottom
15. Layer of glue
16. Lug
17. Trench Fastening member
18. End of travel stop
20. Second portion
21. External wall
22. Window
23. Application zone
24. Trench
25. Layer of glue
26. Housing
27. End of travel stop
28. Hinge zone
30. Microelectronic device
31. Stud
32. Cable
33. Interface layer
34. Interconnection member
35. Compressible layer
36a,b,c Additional microelectronic device

The invention claimed is:

1. A box for a microelectronic device, comprising:
the microelectronic device;
a connection cable electrically connected to the microelectronic device; and
a first portion and a second portion able to be assembled in order to define, in an assembled position, a housing space for the microelectronic device,
wherein a face of the first portion is facing a face of the second portion in the assembled position, first zones of the faces facing each other and forming an interface for the attaching of said first portion and second portion, second zones of the faces facing each other and forming a cavity for receiving said microelectronic device, at least one among the first portion and the second portion comprising at least one element for electrical connection opening into the cavity and comprising a trench that receives the connection cable, the first portion and the second portion being configured to at least one connection pad of the microelectronic device on the element for electrical connection in the assembled position, and the first portion and the second portion are assembled to bear on the microelectronic device to apply a non-zero force at an interface of the at least one connection pad of the microelectronic device and the connection cable or an interconnection member of the element for electrical connection that is electrically connected to the connection cable.

2. The box according to claim 1, wherein the first portion is configured to exert a bearing on the microelectronic device in the direction of the face of the second portion.

3. The box according to claim 2, wherein the cavity is delimited by a hollow pattern in the first portion, with the hollow pattern having a bottom configured to exert the bearing on the microelectronic device.

4. The box according to claim 1, wherein the interconnection member opens into the cavity in such a way as to render applicable the connection pad of the microelectronic device on the interconnection member in the assembled position.

5. The box according to claim 4, wherein one among the first portion and the second portion that does not comprise said element for electrical connection comprises a lug facing the trench of the element for electrical connection, configured to exert a bearing on the connection cable in the assembled position.

6. The box according to claim 1, wherein the trench of at least one element for connection opens into the cavity and is configured to receive the connection cable in such a way as to render applicable the connection pad of the microelectronic device on the connection cable in the assembled position.

7. The box according to claim 6, wherein the connection cable is compressible.

8. The box according to claim 6, wherein a height of the trench is less than a diameter of the connection cable.

9. The box according to claim 1, wherein the first portion and the second portion each comprise at least one element for electrical connection.

10. The box according to claim 1, wherein the cavity comprises an elastically-deformable compressible member configured to be compressed by the microelectronic device in the assembled position.

11. The box according to claim 1, wherein at least one among the first portion and the second portion comprises a window that opens into the cavity from an outer wall of said portion.

12. The box according to claim 1, wherein the box comprises a glue joint to fasten the first portion onto the second portion in the assembled position.

13. The box according to claim 1, wherein the first portion and the second portion are connected by a hinged connection on an edge of their faces.

14. A method for mounting a microelectronic device in a box, the box comprising a first portion and a second portion that can be assembled in order to define, in an assembled position, a housing space of the microelectronic device, at least one among the first portion and the second portion comprising at least one element for electrical connection, the method comprising:
  setting into place of the microelectronic device in the housing space, the first portion and the second portion not being in the assembled position;
  placing face to face a face of the first portion and a face of the second portion in such a way as to place said portions in the assembled position, first zones of the faces facing each other and forming an interface for the fastening of said first portion and said second portion, second zones of the faces facing each other and forming a cavity for receiving the microelectronic device; and
  applying at least one connection pad of the microelectronic device on the element for electrical connection in the assembled position of the first portion and of the second portion,
  wherein the element for electrical connection comprises a trench that receives a connection cable electrically connected to the microelectronic device, and
  wherein the first portion and the second portion are assembled to bear on the microelectronic device to apply a non-zero force at an interface of the at least one connection pad of the microelectronic device and the connection cable or an interconnection member of the element for electrical connection that is electrically connected to the connection cable.

15. The box according to claim 1, wherein the box comprises more than one of the microelectronic devices and each of the microelectronic devices are electronically connected.

16. The box according to claim 1, wherein the first portion includes a fastening member and the second portion includes a housing that receives the fastening member in the housing to mechanically fasten the first portion and the second portion.

17. The box according to claim 1, wherein the first portion includes a fastening member with a hook and the second portion includes a stop, and the fastening member is inserted against the stop via elastic deformation to mechanically fasten the first portion and the second portion.

18. The box according to claim 1, wherein the trench includes a first trench and second trench that are parallel and oriented in a longitudinal direction of the box.

19. The box according to claim 18, wherein the second portion comprises a window that opens into the cavity from an outer wall of said second portion and a longitudinal axis of the window is perpendicular to a bottom of the cavity, and the window extends between the first trench and the second trench.

20. The box according to claim 1, wherein a height of the trench is less than a diameter of the connection cable such that a portion of the connection cable protrudes out of the trench and into the cavity.

* * * * *